US007632908B2

(12) United States Patent
O'Dell et al.

(10) Patent No.: US 7,632,908 B2
(45) Date of Patent: *Dec. 15, 2009

(54) SUBSTITUTED FLUORENE POLYMERS, THEIR PREPARATION AND USE IN OPTICAL DEVICES (75) Inventors: Richard O'Dell, Taufkirchen (DE); Carl Towns, Stansted (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 10/477,337

(22) PCT Filed: May 10, 2002

(86) PCT No.: PCT/GB02/02167

§ 371 (c)(1),
(2), (4) Date: Apr. 16, 2004

(87) PCT Pub. No.: WO02/092723

PCT Pub. Date: Nov. 21, 2002

(65) Prior Publication Data
US 2004/0170839 A1 Sep. 2, 2004

Related U.S. Application Data (60) Provisional application No. 60/315,623, filed on Aug. 29, 2001.

(30) Foreign Application Priority Data

May 11, 2001 (GB) ................................. 0111549.2

(51) Int. Cl.
C08G 79/08 (2006.01)
H01J 1/62 (2006.01)
(52) U.S. Cl. .......................... 528/4; 428/690; 428/917; 313/504; 313/506
(58) Field of Classification Search ................ 428/690, 428/917; 313/503, 506; 257/40; 528/4
See application file for complete search history.

(56) References Cited

U.S. PATENT DOCUMENTS

| 4,539,507 | A   | 9/1985  | VanSlyke et al. ............. 313/504 |
| 5,312,707 | A   | 5/1994  | Ota et al. ....................... 430/59 |
| 5,621,131 | A   | 4/1997  | Kreuder et al. ................. 558/46 |
| 5,698,740 | A   | 12/1997 | Enokida et al. ............. 564/308 |
| 5,766,515 | A   | 6/1998  | Jonas et al. ................... 252/500 |
| 5,777,070 | A   | 7/1998  | Inbasekaran et al. ........ 528/394 |
| 5,962,631 | A   | 10/1999 | Woo et al. ..................... 528/397 |
| 6,309,763 | B1* | 10/2001 | Woo et al. ..................... 428/690 |
| 6,444,334 | B1* | 9/2002  | Doi et al. ...................... 428/690 |
| 6,514,632 | B1* | 2/2003  | Woo et al. ..................... 428/690 |
| 6,653,438 | B1  | 11/2003 | Spreitzer et al. ............. 528/394 |
| 6,861,502 | B1  | 3/2005  | Towns et al. ................. 528/422 |
| 6,897,473 | B1  | 5/2005  | Burroughes et al. ........... 257/40 |
| 6,900,285 | B2* | 5/2005  | Woo et al. ..................... 528/373 |

FOREIGN PATENT DOCUMENTS

| DE | 198 46 767 A1 | 4/2000 |
| EP | 0 259 229 | 3/1988 |
| EP | 0 686 662 A2 | 12/1995 |
| EP | 0 842 208 | 5/2000 |
| EP | 0 707 020 | 8/2000 |
| EP | 1 088 875 A2 | 4/2001 |
| JP | 6107605 | 4/1994 |
| JP | 7145372 | 6/1995 |
| JP | 7301928 | 11/1995 |
| WO | WO 90/13148 | 11/1990 |
| WO | WO 99/20675 | 4/1999 |
| WO | WO 99/48160 | 9/1999 |
| WO | WO 99/54385 | 10/1999 |
| WO | WO 00/22026 | 4/2000 |
| WO | WO 00/46321 | 8/2000 |
| WO | WO 00/53656 | 9/2000 |
| WO | WO 00/55927 | 9/2000 |
| WO | WO 01/49769 | 7/2001 |
| WO | WO 02/26859 | 4/2002 |

OTHER PUBLICATIONS

"Thermally, Stable, Blue Light Emitting Copolymers Derived from 2,7-Dibromo-9,9-Dialkylfluorenes", Miller et al., Polym. Prepr. (Am. Chem. Soc., Div. Polym. Chem.) 38(1), 1997, pp. 421-422.
"Polyfluorenes with Polyphenylene Dendron Side Chains: Toward Non-Aggregating, Light-Emitting Polymers", Setayesh et al., J. Am. Chem. Soc. 123, 2001, pp. 946-953.
International Search Report in PCT/GB02/02167 dated Jul. 18, 2002.
International Preliminary Examination Report in PCT/GB02/02167 dated Jul. 3, 2003.
Search Report in GB 0111549.2 dated Nov. 1, 2001.

(Continued)

Primary Examiner—D. Lawrence Tarazano
Assistant Examiner—Camie S Thompson
(74) Attorney, Agent, or Firm—Marshall, Gerstein & Borun LLP (57) ABSTRACT A polymer for use in an optical device comprising a hole transporting region, an electron transporting region, an emissive region, said polymer comprising an optionally substituted repeat unit of formula (I):

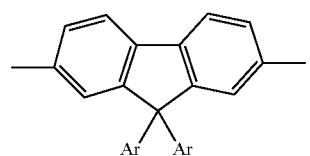

(I)

wherein each Ar is the same or different and comprises an optionally substituted aryl group.

22 Claims, 1 Drawing Sheet

OTHER PUBLICATIONS

Kreyenschmidt et al., "Thermally Stable Blue-Light-Emitting Copolymers of Poly(alkylfluorene)," *Macromolecules*, 31:1099-1103 (1998).

Lee et al., "Novel Polymers Based on Poly(fluorine)s for LED Application", *Part of the SPIE Conference on Organic Photonic Materials and Devices, SPIE* vol. 3623:2-12 (1999).

* cited by examiner

Figure 1

PRIOR ART

SUBSTITUTED FLUORENE POLYMERS, THEIR PREPARATION AND USE IN OPTICAL DEVICES

This is the U.S. national phase of International Application No. PCT/GB02/02167 filed May 10, 2002, the entire disclosure of which is incorporated herein by reference and the priority benefit under 35 U.S.C. §119(e) of U.S. provisional application Ser. No. 60/315,623 filed Aug. 29, 2001, is hereby claimed.

FIELD OF THE INVENTION

The invention relates to materials for optical devices, in particular organic electroluminescent devices, and the control of their physical properties.

BACKGROUND OF THE INVENTION

One class of opto-electrical devices is those using an organic material for light emission or detection. The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO 90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

Figure 1:
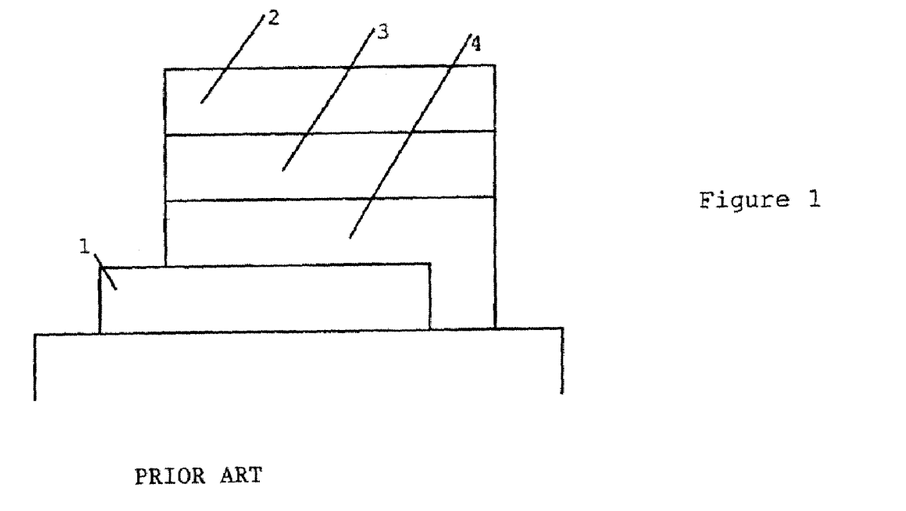
FIG. 1 illustrates the cross-sectional structure of a typical organic light-emissive device ("OLED").

FIG. 1 illustrates the cross-sectional structure of a typical organic light-emissive device ("OLED"). The OLED is typically fabricated on a glass or plastic substrate 1 coated with a transparent first electrode 4 such as indium-tin-oxide ("ITO"). A layer of a thin film of at least one electroluminescent organic material 3 covers the first electrode. Finally, a cathode 2 covers the layer of electroluminescent organic material. The cathode is typically a metal or alloy and may comprise a single layer, such as aluminium, or a plurality of layers such as calcium and aluminium. Other layers can be added to the device, for example to improve charge injection from the electrodes to the electroluminescent material. For example, a hole injection layer such as poly(ethylene dioxythiophene)/polystyrene sulfonate (PEDOT-PSS) or polyaniline may be provided between the anode 4 and the electroluminescent material 3. When a voltage is applied between the electrodes from a power supply one of the electrodes acts as a cathode and the other as an anode.

For organic semiconductors important characteristics are the binding energies, measured with respect to the vacuum level of the electronic energy levels, particularly the "highest occupied molecular orbital" (HOMO) and the "lowest unoccupied molecular orbital" (LUMO) level. These can be estimated from measurements of photoemission and particularly measurements of the electrochemical potentials for oxidation and reduction. It is well understood in this field that such energies are affected by a number of factors, such as the local environment near an interface, and the point on the curve (peak) from which the value is determined. Accordingly, the use of such values is indicative rather than quantitative.

A focus in the field of polymer OLEDs is the development of full colour displays for which red, green and blue emissive materials are required. For commercial applications, it is desirable for the OLED to have a lifetime of several thousand hours (by "lifetime" is meant the time for the brightness of the OLED to fall from 100 cd/m$^2$ to 50 cd/m$^2$ when operated under DC drive at room temperature). One drawback with existing polymer OLED displays relevant to this development is the relatively short lifetime of blue emissive materials known to date. The lifetime of the emissive material may be extended by optimisation of the OLED architecture; for example lifetime of the red, green and blue materials may be dependant on the cathode being used. However, a polymer (in particular a blue electroluminescent polymer) that is inherently stable, i.e. one having a high lifetime in a variety of OLED architectures, is clearly desirable.

WO 00/55927 discloses a polymer of formula (a):

(a)

wherein w+x+y=1, w<0.5, 0≦x+y≦0.5 and n<2

This application does not disclose polymers comprising diphenylfluorene repeat units.

WO 00/22026 discloses polymers of formula (b):

wherein X is 97 or 99 and Y is 3 or 1 respectively. These polymers are disclosed for use in electroluminescent devices.

Other disclosures of electroluminescent polymers comprising diphenylfluorene repeat units include:
EP 1088875 which discloses a copolymer based on 9-(4-adamantylphenyl-10-phenylanthracene and 2-adamantylfluorene repeat units;
WO 99/20675 which discloses a 1:1 copolymer of 9,9-di-n-octylfluorene and 9,9-di(4-methoxyphenyl)fluorene.

It is an object of the present invention to provide a means for increasing the lifetime of polymers for use in an optical device above that of prior art polymers. It is a further object of the invention to provide a long-lived polymer for use in an optical device, particularly a long-lived blue electroluminescent material. It is a yet further object of the invention to provide a means for increasing the thermal stability of prior art polymers.

DETAILED DESCRIPTION

The present inventors have surprisingly found that the lifetime of a polymer for use in an optical device, in particular an electroluminescent polymer, may be increased by the incorporation of repeat units that increase the glass temperature (Tg) of the polymer. In particular, incorporation of 2,7-linked 9,9-diarylfluorene repeat units into an electroluminescent polymer, particularly a blue emissive electroluminescent polymer, results in significant increase in that polymer's lifetime. In addition to its effect on lifetime of a polymer, an increase in the Tg of a polymer is inherently desirable because of the increase in thermal stability.

Accordingly, in a first aspect the invention provides a polymer for use in an optical device comprising:
    a hole transporting region
    an electron transporting region, and
    an emissive region
said polymer comprising an optionally substituted repeat unit of formula (I):

wherein each Ar is the same or different and comprises an optionally substituted aryl group.

Preferably, each Ar is independently selected from the group comprising an optionally substituted residue of formula (II):

wherein n=1, 2 or 3 and R is a solubilising group or hydrogen. Particularly preferred groups R are hydrogen and optionally substituted alkyl or alkoxy. Most preferably, R is hydrogen or butyl. By "butyl" is meant n-, sec- or tert-butyl 9,9-diarylfluorene repeat units present in polymers as disclosed in the aforementioned prior art have been used for the purpose of electron transport and/or as a linking group for a second repeat unit. To this end, these prior art polymers consist of 50% or more of 9,9-diarylfluorene units. However, the present inventors have determined that a lower amount of repeat units of formula (I) may be employed for the purpose of increasing glass transition temperature by comparison with a corresponding polymer not comprising repeat units of formula (I). Accordingly, the polymer of the invention preferably comprises less than 50 mol %, more preferably 10-40 mol % of repeat units of formula (I).

Preferably, the polymer is an electroluminescent polymer. More preferably, the polymer is a blue electroluminescent polymer. By "blue electroluminescent polymer" is meant a polymer that by electroluminescence emits radiation having a wavelength in the range of 400-500 nm, preferably 430-500 nm.

In a second aspect, the invention provides an optical device, preferably an electroluminescent device, comprising a first electrode for injection of positive charge carriers, a second electrode for injection of negative charge carriers and a layer located between the first and second electrode comprising a polymer comprising:
    a hole transporting region
    an electron transporting region
    an emissive region said polymer comprising a repeat unit of formula (I):

(I)

wherein each Ar is the same or different and comprises an optionally substituted aryl group.

In a third aspect, the invention provides a method of controlling the glass transition temperature of a polymer which comprises polymerising in a polymerisation mixture a monomer of formula (III):

(III)

wherein each Ar is the same or different and comprises an optionally substituted aryl group and each P is a functional group for polymerisation, the process comprising the steps of polymerising an amount of the monomer of formula (III) required to reach a preselected glass transition temperature.

Preferably, monomers of formula (III) comprise less than 50 mol %, more preferably 10-40 mol %, of monomers in the polymerisation mixture of monomers in the polymerisation mixture.

Two polymerisation techniques that are particularly amenable to preparation of conjugated polymers from aromatic monomers are Suzuki polymerisation as disclosed in, for example, WO 00/53656 and Yamamoto polymerisation as disclosed in, for example, "Macromolecules", 31, 1099-1103 (1998). Suzuki polymerisation entails the coupling of halide and boron derivative functional groups; Yamamoto polymerisation entails the coupling of halide functional groups. Accordingly, it is preferred that each P is independently selected from the group consisting of (a) boron derivative functional groups selected from boronic acid groups, boronic ester groups and borane groups and (b) halide functional groups.

Preferably, the method comprises a step of reacting a first monomer of formula (III) with a second monomer that may be the same or different from the first monomer in the presence of a metal co-ordination complex catalyst and under conditions so as to polymerise the monomers to form a polymer.

Preferably, the method comprises a step of polymerizing in a reaction mixture (a) a first aromatic monomer having at least two boron derivative functional groups selected from a boronic acid group, a boronic ester group and a borane group, and a second aromatic monomer having at least two reactive halide functional groups wherein at least one of the first or second aromatic monomers comprises a monomer of formula (III); or (b) an aromatic monomer of formula (III) having one reactive halide functional group and one boron derivative functional group selected from a boronic acid group, a boronic ester group and a borane group, wherein the reaction mixture comprises a catalytic amount of a catalyst suitable for catalysing the polymerisation of the aromatic monomers, and a base in an amount sufficient to convert the boron derivative functional groups into —BX$_3^-$ anionic groups, wherein X is independently selected from the group consisting of F and OH.

Preferably, the base is an organic base, more preferably a tetra-alkylammonium carbonate or hydroxide as disclosed in WO 00/53656.

In a fourth aspect, the invention provides use of an optionally substituted repeat unit of formula (I) in a polymer, preferably an electroluminescent polymer, as a glass transition temperature enhancing agent:

(I)

wherein each Ar is as defined above.

In a fifth aspect, the invention provides an polymer, preferably an electroluminescent polymer, comprising less than 50 mol %, preferably 10-40 mol % of an optionally substituted repeat unit of formula (I):

(I)

wherein each Ar is as defined above.

Each region may comprise a single repeat unit or a plurality of repeat units conjugated together. Each of the hole transporting region, electron transporting region and emissive region may only occur once within the polymer. A region may only occur once within the polymer, particularly when it comprises an extended chain of conjugated repeat units. Alternatively, there may be a plurality of one or more of the hole transporting region, electron transporting region and emissive region distributed throughout the polymer. It should be noted that each of the three regions are chemically different from one another, i.e. preferably, in use, a given region will not function as more than one of a hole transport region, an electron transport region or an emissive region.

The terms "hole transporting region", "electron transporting region" and "emissive region" are defined relative to one another as outlined below.

By "hole transporting region" is meant a region having a HOMO level lower than the HOMO level of the emissive region or the electron transporting region.

By "electron transporting region" is meant a region having a LUMO level higher than the LUMO level of the emissive region or the hole transporting region. located between the LUMO level of the emissive region and the workfunction of the cathode of the device in which the polymer of the invention is used. Typically; the workfunction of the cathode is around 2.5 eV By "emissive region" is meant a region having a HOMO-LUMO bandgap smaller than that of the hole transporting region or the electron transporting region.

The HOMO and LUMO levels and bandgaps of a region of the polymer may be accurately estimated by measuring the HOMO level of a corresponding homopolymer or 1:1 copolymer by cyclic voltammetry. The LUMO level of a region may also be measured in this way, alternatively, it may be calculated by measurement of the HOMO level and the HOMO-LUMO bandgap. Furthermore, the emissive region will be readily identifiable from on the electroluminescent spectra of homopolymers or 1:1 copolymers corresponding to each region.

Substantially all hole transport, electron transport or emission will arise from regions meeting the corresponding definition given above, however a relatively minor amount of hole transport, electron transport or emission may be due to regions not meeting the corresponding definition. For example, a relatively minor amount of emission may be observed from a hole or electron transporting region if the HOMO-LUMO bandgap of that region is not much greater than the HOMO-LUMO bandgap of the emissive region.

A typical electroluminescent device comprises an anode having a workfunction of 4.8 eV. Accordingly, the HOMO level of the hole transporting region is preferably around 4.8-5.5 eV. Similarly, the cathode of a typical device will have a workfunction of around 3 eV. Accordingly, the LUMO level of the electron transporting region is preferably around 3-3.5 eV.

Preferred as hole transporting regions are triarylamines as disclosed in, for example, WO 99/54385 the contents of which are incorporated herein by reference.

Preferred as electron transporting regions are 2,7-linked fluorene repeat units and conjugated chains thereof. Particularly preferred polyfluorenes include 2,7-linked-9,9-dialkyl fluorenes as disclosed in, for example, EP 0842208, the contents of which are incorporated herein by reference; spirobifluorenes as disclosed in, for example, EP 0707020, the contents of which are incorporated herein by reference, and indenofluorenes. In addition, repeat units of formula (I), and conjugated chains thereof, may function as electron transporting regions as well as serving to increase the glass transition temperature of polymers of the invention. Also preferred as electron transporting regions are 1,4-linked phenyl repeat units and conjugated chains thereof.

Preferred as emissive regions are emissive repeat units as disclosed in WO 00/55927 and WO 00/46321, the contents of which are incorporated herein by reference. A particularly preferred blue emissive repeat unit comprises an optionally substituted repeat unit of formula (IV):

(IV)

Wherein each R' is independently selected from hydrogen or a solubilising group. Particularly preferred solubilising groups are optionally substituted alkyl or alkoxy. Most preferably, R' is n-butyl.

Each of the hole transporting region, electron transporting region and emissive region may be provided as part of the polymer backbone as disclosed in, for example, WO 00/55927. Alternatively, one or more of the said regions may be pendant from the polymer backbone as disclosed in, for example, WO 01/49769 and WO 02/26859 wherein hole transporting regions are pendant from an electron transporting backbone.

EXAMPLES

Monomer Examples

Monomers according to the invention were prepared in accordance with the scheme below:

Monomer Example M1

2,7-dibromo-9,9-diphenylfluorene 2,7-Dibromofluorenone

In a 3L flange flask fluorenone (100.006 g, 0.555 mol), phosphorus pentoxide (110.148 g, 0.776 mol) and trimethylphosphate (1200 mL) were mixed. Under mechanical stirring, a solution of bromine (63 mL, 1.23 mol) in trimethylphosphate (200 mL) was quickly added. This clear solution was then heated for 22 hours at 120° C. The mixture was allowed to cool to room temperature, then poured into 3 L of water. When sodium thiosulfate was added (50.045 g) the mixture turned yellow. Stirring was maintained for 1 hour then the yellow solid was filtered. This solid was heated in methanol to remove the mono-brominated compound and gave 176.183 g (98% pure by HPLC, 94% yield).
$^1$H NMR (CDCl$_3$) 7.73 (2H, d, J 2.0), 7.61 (2H, dd, J 7.6, 2.0), 7.36 (2H, d, J 8.0); $^{13}$C NMR (CDCl$_3$) 142.3, 137.5, 135.3, 127.9, 123.3, 121.8, 109.8.

4,4'-Dibromo-2-carboxylic acid-1,1'-biphenyl

In a 2 L flange flask 2,7-dibromofluorenone (120.526 g, 0.356 mol), potassium hydroxide (finely powdered flakes, 168.3279 g, 3.000 mol) and toluene (600 mL) were placed. This mixture was heated at 120° C. for four hours then left to cool to room temperature. Water was added to dissolve the solid (~2 L) under vigorous stirring. The greenish aqueous layer was removed and the yellow toluene layer was washed twice with water. The combined aqueous layers were acidified with concentrated hydrochloric acid then the precipitated solid was filtered, dried then recrystallised from toluene to give 100.547 g of off white crystals (79% yield); $^1$H NMR ((CD$_3$)$_2$CO) 8.00 (1H, d, J 2.0), 7.77 (1H, dd, J 8.0, 2.4), 7.57 (2H, d, J 8.0), 7.34 (1H, d, J 8.4), 7.29 (2H, d, J 8.8); $^{13}$C NMR ((CD$_3$)$_2$CO) 167.1, 140.4, 139.8, 134.2, 133.5, 132.8, 132.7, 131.2, 130.6, 121.4, 121.1.

Methyl ester of 4,4'-dibromo-2-carboxylic acid-1,1'-biphenyl

4,4-dibromo-2-carboxylic acid biphenyl (171.14 g, 0.481 mol) was suspended in methanol (700 mL) and sulfuric acid (15 mL) then heated at 80° C. for 21 hours. The solvent was removed and the oil was dissolved in ethyl acetate. This solution was washed with 2N sodium hydroxide, water, saturated sodium chloride, dried over magnesium sulfate, filtered and evaporated to give an orange oil. This oil was treated with hot methanol, on cooling the ester precipitated out and was filtered. The mother liquor was evaporated and the solid recrystallised giving additional product. The ester was 100% pure by GCMS, a yield of 123.27 g (69%) was obtained; $^1$H NMR (CDCl$_3$) 7.99 (1H, d, J 2.0), 7.64 (1H, dd, J 8.0, 1.6), 7.51 (2H, d, J 8.4), 7.19 (1H, d, J 8.8), 7.13 (2H, d, J 8.8), 3.67 (3H, s); $^{13}$C NMR (CDCl$_3$) 167.1, 140.3, 139.1, 134.4, 132.9, 132.1, 132.0, 131.3, 129.8, 121.9, 121.5, 52.3; GCMS: M$^+$=370

4,4'-dibromo-2-diphenyl alcohol-1,1'-biphenyl 4,4-dibromo-2-methyl ester-biphenyl (24.114 g, 65.1 mmol) was dissolved in dry diethyl ether (120 mL) and the solution was cooled to −60° C. by using an isopropanol/dry ice bath. Phenyl lithium (1.8M solution in cyclohexane-ether, 91 mL) was then added dropwise. The mixture was stirred and let to warm to room temperature. The reaction was complete after four hours. Water was added (70 mL) then the aqueous layer washed once with diethyl ether. Combined organic phases were washed with sodium chloride, dried over magnesium sulfate, filtered and evaporated to give a yellow powder. Recrystallisation from isopropanol afforded 19 g of white solid (59% yield);GC-MS (m/z, relative intensity %) 494 (M$^+$, 100); $^1$H NMR (CDCl$_3$) 7.43 (1H, dd, J 8.4, 2.4), 7.28 (6H, m), 7.23 (2H, d, J 8.0), 7.11 (4H, m), 6.99 (1H, d, J 2.4), 6.94 (1H, d, J 8.4), 6.61 (2H, d, J 8.4); $^{13}$C NMR (CDCl$_3$) 147.5, 146.7, 140.3, 139.3, 134.0, 133.0, 131.2, 131.1, 130.3, 128.2, 128.1, 127.8, 121.8, 121.3, 83.2.

2,7-dibromo-9,9-diphenylfluorene

The alcohol (69.169 g, 140 mmol) and glacial acetic acid (450 ml) were stirred and heated to reflux, then concentrated hydrochloric acid (0.5 ml) was added dropwise. When the addition was completed the mixture was heated for one hour and then cooled. The reaction mixture was poured into water (500 ml), after which the solid was filtered off. The white solid was recrystallised from n-butyl acetate three times to give 20.03 g of desired product (99.59% by HPLC, 30% yield).

$^1$H NMR (CDCl$_3$), δ/ppm: 7.58 (2H, d, J 7.6), 7.49 (2H, d, 1.2), 7.48 (2H, dd, 1.6), 7.25 (6H, m), 7.14 (4H, m). $^{13}$C NMR (CDCl$_3$), δ/ppm: 153.2, 144.6, 138.3, 131.1, 129.6, 128.7, 128.2, 127.4, 122.0, 121.7, 65.8.

Monomer Examples M2-M4

Monomers with Ar groups as detailed in the table below were prepared in accordance with the scheme and general experimental process outlined above. Aryllithium compounds corresponding to Ar groups shown in the table were prepared from the corresponding aryl bromide.

| Monomer example no. | Ar | Yield of monomer |
|---|---|---|
| M2 | | 90% |
| M3 | | 24% |
| M4 | | 22% |

Polymer Example P1

A blue electroluminescent polymer according to the invention was prepared in accordance with the process of WO 00/53656 by reaction of 9,9-di-n-octylfluorene-2,7-di(ethylenylboronate) (0.5 equivalents), 2,7-dibromo-9,9-diphenylfluorene (0.3 equivalents), N,N-di(4-bromophenyl)-sec-butylphenylamine (0.1 equivalents) and N,N'-di(4-bromophenyl)-N,N'-di(4-n-butylphenyl)-1,4-diaminobenzene (0.1 equivalents) to give polymer P1:

Polymer Examples P2-P4

Polymers were prepared in accordance with the method of example P1 except that ratios of 9,9-dioctylfluorene repeat units and 9,9-diphenylfluorene repeat units present in the polymer were varied as follows:

| Example no. | 9,9-diphenylfluorene (mol %) | 9,9-dioctylfluorene (mol %) |
|---|---|---|
| P2 | 50 | 30 |
| P3 | 60 | 20 |

Polymer Example P5

A polymer was prepared in accordance with the method of example P1 except that 2,7-dibromo-9,9-di(biphenyl)fluorene (monomer example M3; 0.3 eq) was used in place of 2,7-dibromo-9,9-diphenylfluorene.

Comparative Polymer Example

A blue emissive polymer, as disclosed in WO 00/55927, was prepared in accordance with polymer example 1 wherein all 9,9-diphenylfluorene repeat units were replaced with 9,9-di-n-octylfluorene repeat units. This was done by following the preparation of polymer example 1 except that 0.3 equivalents of 2,7-dibromo-9,9-di-n-octylfluorene was used in place of 2,7-dibromo-9,9-diphenylfluorene.

Device Example

Onto a glass substrate carrying an ITO substrate of thickness was deposited by spin coating poly(ethylenedioxythiopene)/polystyrene sulfonate (available from Bayer™ as Baytron P™) to a thickness of 270 microns. Over this was deposited a polymer according to the invention to a thickness of 50 nm by spin coating. A layer of lithium fluoride (thickness 4 nm) was deposited onto the polymer by evaporation followed by a cathode of calcium (thickness 50 nm), again deposited by evaporation. The device was encapsulated using a metal can.

Comparative Device Example

A device was prepared in accordance with the method outlined for the device example above except that the comparative polymer described above was used in place of the polymer according to the invention.

Results

The table below provides glass transition temperature data for polymers described above.

| Polymer example | Glass transition temperature (° C.) |
|---|---|
| Comparative example | ca. 80 |
| P1 | 140 |
| P2 | 210 |
| P3 | 240 |
| P4 | 175 |

As can be seen, polymers according to the invention have significantly higher Tg values than the comparative prior art polymer, giving them greater thermal stability. Tg increases with the quantity of repeat units of formula (I) incorporated into the polymer. Furthermore, different repeat units of formula (I) differ in the extent to which they affect Tg. Thus, polymer P4 (comprising 30% di(biphenyl)fluorene repeat units) has a higher Tg than polymer P1 (comprising 30% diphenylfluorene repeat units).

In addition to the increase in thermal stability, polymers P1-P4 have a lifetime of around 3,000 hours or more whereas the comparative polymer example has a lifetime of around 1,000 hours.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A polymer for use in an optical device, the polymer comprising;
   a hole transporting region;
   an electron transporting region; and,
   an emissive region,
   said polymer comprising an optionally substituted repeat unit of formula (I):

(I)

wherein each Ar is the same or different and comprises an optionally substituted aryl group, wherein each of the hole transporting region, the electron transporting region, and the emissive region is chemically different from one another, and wherein the polymer comprises a plurality of fluorene repeat units conjugated together.

2. A polymer according to claim 1 wherein each Ar is independently selected from the group comprising an optionally substituted residues of formula (II):

(II)

wherein n=1, 2 or 3 and R is a solubilizing group or hydrogen.

3. A polymer according to claim 2 wherein R is selected from the group consisting of optionally substituted alkyl and optionally substituted alkoxy groups.

4. A polymer according to claim 2 wherein R is hydrogen or butyl.

5. A polymer according to claim 1 comprising less than 50 mol % of repeat units of formula (I).

6. A polymer according to claim 5 comprising 10-40 mol % of repeat units of formula (I).

7. A polymer according to claim 1 wherein the electron transporting region comprises at least one repeat unit of formula (I).

8. A polymer according to claim 1 wherein the electron transporting region does not comprise a repeat unit of formula (I).

9. A polymer according to claim 1 capable of emitting light in the wavelength range 400-500 nm.

10. An optical device comprising a first electrode for injection of positive charge carriers, a second electrode for injection of negative charge carriers, and a layer located between the first and second electrode comprising a polymer as defined in claim 1.

11. A polymer according to claim 1 capable of emitting light in the wavelength range of 430-500 nm.

12. A polymer according to claim 1, wherein the hole transporting region comprises a triarylamine moiety and the emissive region comprises an optionally substituted repeat unit of formula (IV):

wherein R' is hydrogen or a solubilizing group.

13. A method of controlling the glass transition temperature of a polymer which comprises polymerizing in a polymerization mixture a monomer of formula (III):

(III)

wherein each Ar is the same or different and comprises an optionally substituted aryl group and each P is a functional group for polymerization, the process comprising the steps of polymerizing an amount of the first monomer of formula (III) required to reach a preselected glass transition temperature with second and third monomers to polymerize the first, second, and third monomers to form a polymer comprising a hole transporting region, an electron transporting region, and an emissive region, wherein each of the hole transporting region, the electron transporting region, and the emissive region is chemically different from one another, and wherein the polymer comprises a plurality of fluorene repeat units conjugated together.

14. A method according to claim 13 wherein each Ar comprising an optionally substituted residue of formula (II):

(II)

wherein n=1, 2 or 3 and R is a solubilizing group or hydrogen.

15. A method according to claim 14 wherein R is selected from the group consisting of optionally substituted alkyl and optionally substituted alkoxy groups.

16. A method according to claim 13 wherein monomers of formula (III) comprise less than 50 mol % of monomers in the polymerization mixture.

17. A method according to claim 16 wherein monomers of formula (III) comprise 10-40 mol % of monomers in the polymerization mixture.

18. A method according to claim 13 wherein each P is independently selected from the group consisting of (a) boron derivative functional groups selected from boronic acid groups, boronic ester groups and borane groups and (b) halide functional groups.

19. A method according to claim 13 comprising a step of reacting the monomer of formula (III) with the second and third monomers in the presence of a metal co-ordination complex catalyst.

20. A method according to claim 13 wherein the first monomer has one of (i) at least two boron derivative functional groups selected from boronic acid groups, boronic ester groups and borane groups, and (ii) at least two reactive halide functional groups, and at least one of the second and third monomers has the other of (i) at least two boron derivative functional groups selected from boronic acid groups, boronic ester groups and borane groups, and (ii) at least two reactive halide functional groups; or the first monomer has one reactive halide functional group and one boron derivative functional group selected from boronic acid groups, boronic ester groups and borane groups, and at least one of the second and third monomers also has one reactive halide functional group and one boron derivative functional group selected from boronic acid groups, boronic ester groups and borane groups, wherein the reaction mixture comprises a catalytic amount of a catalyst suitable for catalyzing the polymerization of the aromatic monomers, and a base in an amount sufficient to convert the boron derivative functional groups into $—BX_3^-$ anionic groups, wherein X is independently selected from the group consisting of F and OH.

21. A method according to claim 19 wherein the base is an organic base.

22. A method according to claim 13 wherein the polymer is an electroluminescent polymer.

* * * * *